(12) United States Patent
Ahmed

(10) Patent No.: US 10,332,570 B1
(45) Date of Patent: Jun. 25, 2019

(54) CAPACITIVE LINES AND MULTI-VOLTAGE NEGATIVE BITLINE WRITE ASSIST DRIVER

(71) Applicant: ADVANCED MICRO DEVICES, INC., Santa Clara, CA (US)

(72) Inventor: Tawfik Ahmed, Austin, TX (US)

(73) Assignee: Advanced Micro Devices, Inc., Santa Clara, CA (US)

(\*) Notice: Subject to any disclaimer, the term of this patent is extended or adjusted under 35 U.S.C. 154(b) by 0 days.

(21) Appl. No.: 15/838,955

(22) Filed: Dec. 12, 2017

(51) Int. Cl.
| | |
|---|---|
| *G11C 7/12* | (2006.01) |
| *G06F 1/3234* | (2019.01) |
| *G11C 7/22* | (2006.01) |
| *G11C 11/4074* | (2006.01) |
| *G11C 7/10* | (2006.01) |
| *G06F 1/3296* | (2019.01) |

(52) U.S. Cl.
CPC .............. *G11C 7/12* (2013.01); *G06F 1/3275* (2013.01); *G06F 1/3296* (2013.01); *G11C 7/1096* (2013.01); *G11C 7/22* (2013.01); *G11C 11/4074* (2013.01)

(58) Field of Classification Search
CPC ........... G11C 7/12; G11C 7/1096; G11C 7/22; G11C 11/4074; G06F 1/3296; G06F 1/3275

See application file for complete search history.

(56) References Cited

U.S. PATENT DOCUMENTS

| | | | |
|---|---|---|---|
| 7,109,541 B2* | 9/2006 | Jacquet | G11C 11/4125 257/295 |
| 9,349,438 B2* | 5/2016 | Sano | G11C 7/12 |
| 2010/0250981 A1 | 9/2010 | Pamley et al. | |
| 2013/0176796 A1* | 7/2013 | Tanabe | G11C 7/00 365/189.011 |
| 2016/0267952 A1 | 9/2016 | Kolar et al. | |

\* cited by examiner

*Primary Examiner* — David Lam

(57) ABSTRACT

A memory device includes a memory cell coupled to a bitline and a bitline complement. A first capacitive structure is charged with a first voltage source such as a memory supply voltage. A second capacitive structure is charged with a second voltage source such as a core supply voltage. A coupling structure selectively and capacitively couples the first capacitive structure and the second capacitive structure to the bitline or the bitline complement, thereby applying a negative bitline write assist to the memory cell during a write operation.

20 Claims, 3 Drawing Sheets

CAPACITIVE LINES AND MULTI-VOLTAGE NEGATIVE BITLINE WRITE ASSIST DRIVER

BACKGROUND

Conventional negative bitline write assist (NBWA) circuits use a pull-down voltage to provide a negative voltage supply or a negative ground reference for a write driver on one of the bitlines coupled to a memory cell. Such techniques are useful in writing a zero ("0") value into the memory cell storing a one ("1") value at a first time and receiving a zero ("0") value at a second time. The pull-down voltage can be provided by a capacitive structure as a step of a write operation. Conventional NBWA circuits often use a single voltage source as the pull-down voltage: a memory voltage or a core voltage. During operation, the single voltage source can vary significantly at any instant of time depending on local demands, conditions, and particular physical structures in the memory circuit. In some situations, the pull-down voltage is too low to provide a sufficient write assist to the memory cell resulting in a failed write to the memory cell. In other situations, the pull-down voltage is too high leading to other problems including causing stability issues on non-selected neighboring memory cells and reliability issues for the device.

Various solutions to these problems have been suggested. One solution is to add a bigger capacitive structure to boost the negative bitline. Such solution comes at the cost of a higher power requirement and higher capacitive area, which may not be physically adjustable in particular circuit architectures due to highly optimized placement of components within known memory circuits. Using a single voltage source with a bigger capacitive structure also does not address the problem inherent at the high source voltage condition.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

In a negative bitline implementation, a capacitive structure is coupled to bitlines of a row or column of memory cells to provide a negative write assist to an activated memory cell of a memory circuit die. In conventional implementations, the capacitive structure is operated with either a core voltage or a memory voltage, which are provided to the memory circuit die. At any particular instant of time, both the core voltage and the memory voltage vary within their respective allowable operative ranges, with the core voltage typically being allowed to vary over a wider range than the memory voltage. Generally, a core voltage is provided for various components supported by a motherboard and a memory voltage is provided for a particular type of memory in a memory device. For example, for double data rate type three (DDR3) synchronous dynamic random-access memory (SDRAM) or DDR3 SDRAM, a memory voltage is supplied at 0.9 volts with a range of 0.8-1.0 volts. In contrast, a core voltage is supplied at 1.2 volts with a range of 0.6-1.3 volts. A core voltage and a core voltage source are used herein to refer to a first voltage and a first voltage source, and a memory voltage and a memory voltage source are used herein to refer to a second voltage and a second voltage source.

To overcome the limitations of a single source voltage for the negative write assist to a memory cell, described herein are various embodiments of using a concurrent combination of the core voltage and the memory voltage as the pull-down voltage for the negative write assist. The negative write assist becomes a function of two voltages instead of one following a general expression of the form $F(V_{DD1}, V_{DD2}) = m_1 \cdot V_{DD1} \, m_2 \cdot V_{DD2}$ where $m_1 = 0\text{-}1$ and $m_2 = 0\text{-}1$. Several benefits are realized with the use of two supply voltages. At low voltages, the pull-down voltage exhibits a crisper edge rate and is guaranteed to be at a higher voltage at all times. At high voltages, the overall pull-down voltage is guaranteed to be lower or more attenuated than when a single source voltage is used, as further described herein.

Figure 1:
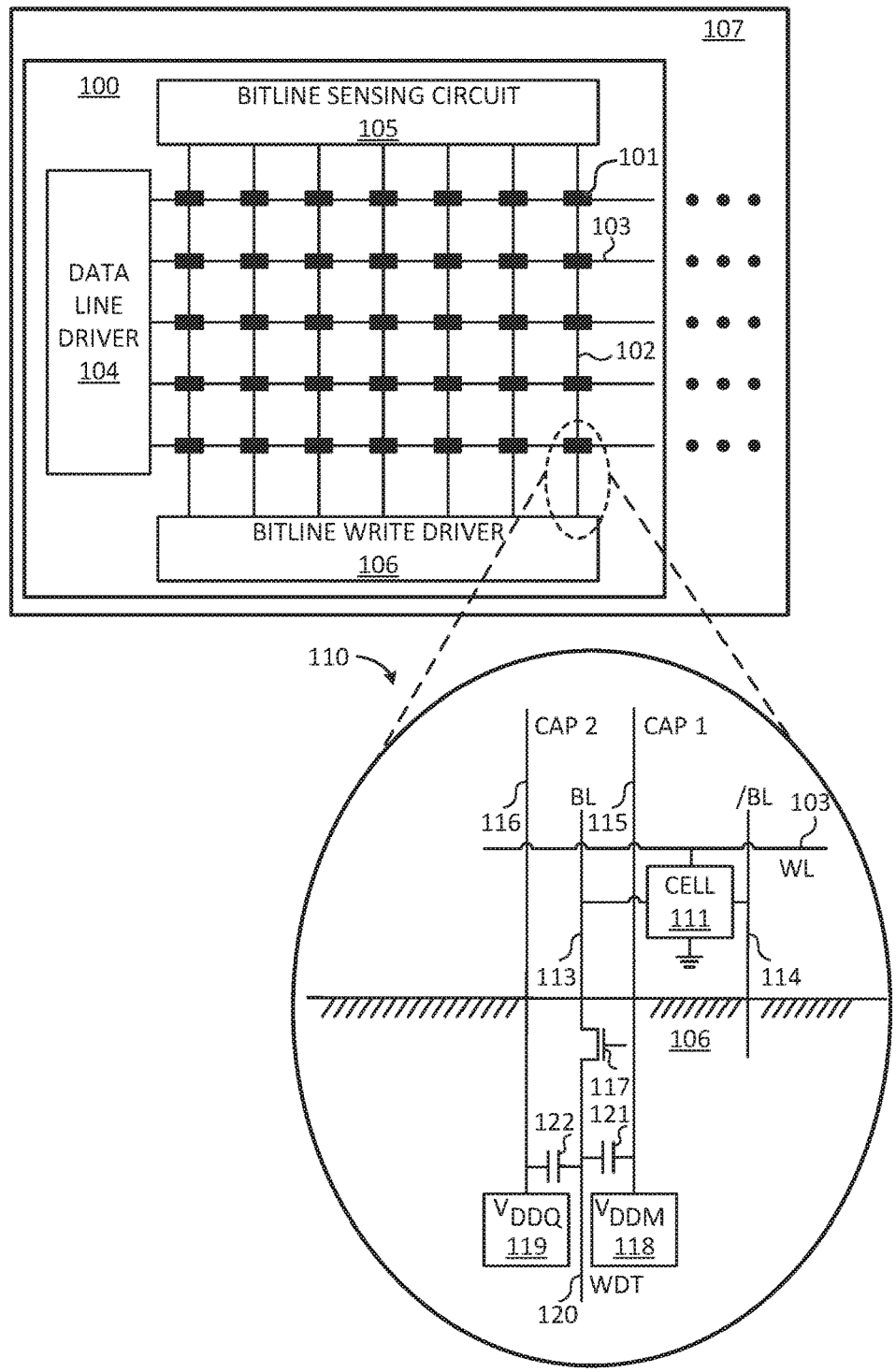
FIG. 1 is a block diagram of capacitive structures and a block of memory cells in accordance with some embodiments.

FIG. 1 is a block diagram of capacitive structures and a block of memory cells in accordance with some embodiments. A memory device 100 is operative in a computing device 107. The memory device 100 includes a set of memory cells 101 arranged in columns and rows. Bitlines 102 and write data lines connect the memory cells to other components. For sake of simplicity of illustration, a single bitline 102 is shown for each column of memory cells 101. In operation, a write line ("WL") or driver line 103 activates a row of memory cells 101 through the driver line 103. Subsequently, either a bitline sensing circuit 105 performs a read operation from a respective activated memory cell or a bitline write driver 106 performs a write operation to the respective activated memory cell. A negative write assist (negative boost) is performed as a step of the overall write operation.

The callout 110 illustrates further details of the structures. Each bitline 102 is actually a bitline pair: a bitline 113 (first bitline) and a bitline complement 114 (second bitline), as further explained herein. The bitline 113 extends along a first side of the memory cell 111 and the bitline complement 114 extends along a second side of the memory cell. The negative boost is provided by a first capacitor 121 and a second capacitor 122 coupled to the bitline 113 at a designated time to a write data true line 120 by activating a boost transistor 117. The first capacitor 121 is triggered by a memory voltage supply 118 ("$V_{DDM}$"). The memory voltage supply 118 is a first voltage supply that supplies a first voltage $V_{DDM}$ to the first capacitor 121. The second capacitor 122 is triggered by a core voltage supply 119 ("$V_{DDQ}$"). The core voltage supply 119 is a second voltage supply that supplies a second voltage $V_{DDQ}$ to the second capacitor 122.

The first capacitor 121 includes a first capacitive structure 115 ("CAP 1"). The second capacitor 122 includes a second capacitive structure 116 ("CAP 2"). According to some embodiments, the capacitive structures 115, 116 extend generally in a same orientation as the bitlines 113, 114. In other implementations, the capacitive structures 115, 116 extend in other orientations with respect to the memory cell 111 and the bitlines 113, 114.

In a write operation, the driver line 103 is activated thereby allowing the memory cell 111 to be accessed by the other components. In turn, the boost transistor 117 couples the write data true line 120 to the bitline 113. The boost transistor 117 is an example of a coupling structure that can be activated to complete steps needed for providing a negative write assist to the memory cell 111. The negative write assist is facilitated by the capacitive structures 115, 116 and the first and second capacitors 121, 122. As used herein, write data lines are synonymous with bitlines. Capacitive structures may be formed proximate to and may be coupled to write data lines and bitlines consistent with providing a negative write assist as known to those in the art.

Figure 2:
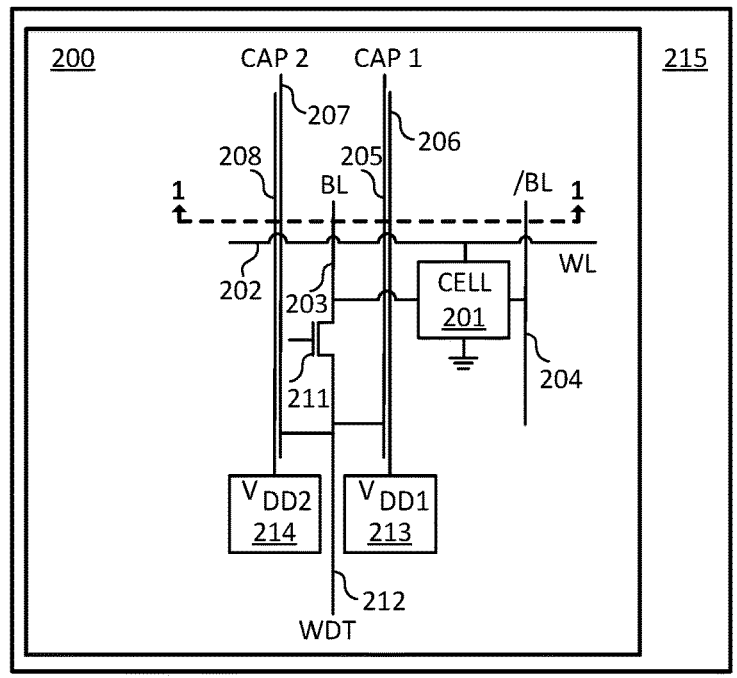
FIG. 2 is a block diagram of capacitive structures and a memory cell in accordance with some embodiments.

FIG. 2 is a block diagram of capacitive structures and a memory cell in accordance with some embodiments. A memory device 200 includes a memory cell 201 and is part of a computing device 215. A write data line 202 extends along a side of, and couples to, the memory cell 201 and, when activated, allows the bitline 203 ("BL") and its bitline complement 204 ("/BL") to communicate with the memory cell 201. Two sets of capacitive structures labeled "CAP 1" and "CAP 2" facilitate a negative bitline write assist. The first set of capacitive structures includes a first capacitive line 205 coupled to a write data true line 212. A first activation line 206 extends parallel to the first capacitive line 205. The first activation line 206 is driven by a first voltage source 213 providing a first voltage $V_{DD1}$ for the negative write assist. The second set of capacitive structures includes a second capacitive line 207 coupled to the write data true line 212. A second activation line 208 extends parallel to the second capacitive line 207. The second activation line 208 is driven by a second voltage source 214 providing a second voltage $V_{DD2}$ for the negative write assist. In operation, a negative bitline boost is created when the first and second voltage sources 213, 214 are applied to the first and second activation lines 206, 208, and the write data true line 212 is coupled to the bitline 203 by activating the bitline transistor 211.

Figure 3:
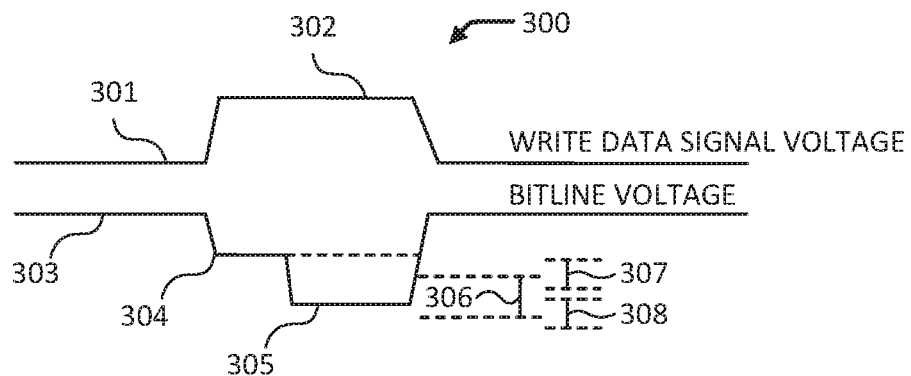
FIG. 3 is a diagram of voltages when coupling capacitive structures to a memory cell in accordance with some embodiments.

FIG. 3 is a diagram of voltages when coupling capacitive structures to a memory cell in accordance with some embodiments. During a write operation, a write data signal voltage changes from a first level 301 to a second level 302. Concurrently, a bitline voltage changes from a first level 303 to a second level 304 in a stage in which a value (zero or one) is written into the memory cell. According to some embodiments, the second level 304 on the bitline is at or near zero volts. During some write operations, a negative write assist is useful.

During a negative write assist, the bitline voltage is brought from the second level 304 to a lower third level 305 using the capacitive structures and other structures described herein. The third level 305 is within a negative boost voltage range 306. The third voltage level 305 is a combination of first and second voltages such as the combination of first and second voltages $V_{DD1}$, $V_{DD2}$ of FIG. 2. In FIG. 3, the negative boost voltage range 306 is a combination of the first voltage range 307 and the second voltage range 308 from a first negative boost voltage and a second negative boost voltage. The negative boost voltage range 306 improves over the first voltage range 307 and improves over the second voltage range 308 because using both a first negative boost voltage from a first voltage source and a second negative boost voltage from a second voltage source allows the negative boost voltage range 306 to remain more predictable and attenuated at all times of operation of a memory circuit. A combined negative boost voltage enables a negative boost that is not limited to a single voltage that dips to its lowest possible level. At high core voltages, the upper limit of the negative bitline write voltage is attenuated relative to the worst of either the first or the second negative write assist voltages alone. When both the first and second voltages are low, because the second voltage range is not as low as the first voltage, a result of using both voltages is a crisper edge rate and a more negative bitline than using just the lower voltage. Thus, there are benefits at both low and high negative write assist supply voltages such as core and memory voltages $V_{DDQ}$, $V_{DDM}$ of FIG. 1 and such as first and second voltages $V_{DD1}$, $V_{DD2}$ of FIG. 2.

Figure 4:
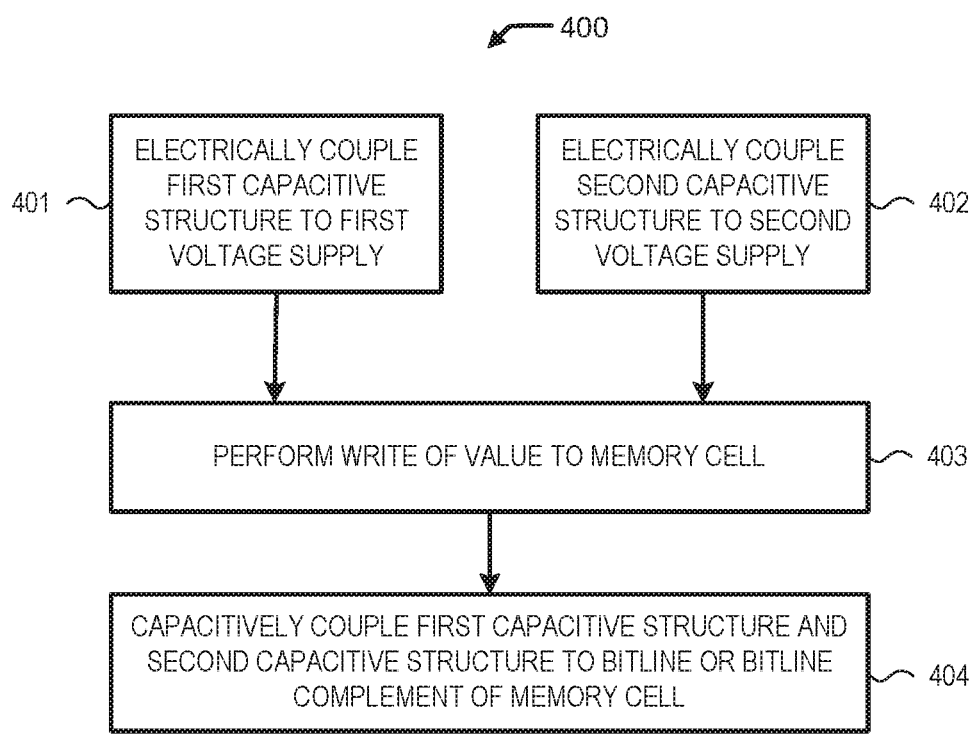
FIG. 4 is a flowchart of a method of using capacitive structures for memory cells in accordance with some embodiments.

FIG. 4 is a flowchart of a method 400 of using capacitive structures for memory cells in accordance with some embodiments. The method 400 is for facilitating improved negative bitline write assist operations in a memory cell. At block 401, a first capacitive structure is electrically coupled to a first voltage supply. At step 402, a second capacitive structure is electrically coupled to a second voltage supply. At step 403, a value is written to the memory cell. At step 404, the first capacitive structure and the second capacitive structure are capacitively coupled to a bitline or a bitline complement of the memory cell.

Figure 5:
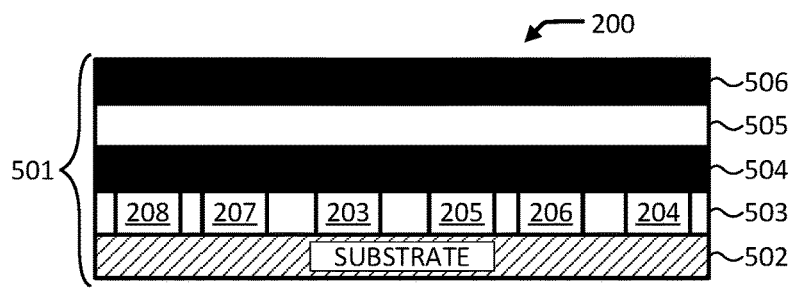
FIG. 5 is a cross-sectional view along line 1-1 of FIG. 2 in accordance with some embodiments.

FIG. 5 is a cross-sectional view along line 1-1 of FIG. 2 in a in accordance with some embodiments. The memory device 200 includes layers 501. The layers 501 include metal layers separated by an insulative layer on top of a substrate 502. For example, a first metal layer 503 is separated from a second metal layer 505 by a first insulative layer 504. A second insulative layer 506 is on top of the second metal layer 505. The first capacitive line 205 as a first capacitive structure and the first activation line 206 are in the first metal layer 503. The second capacitive line 207 as a second capacitive structure and the second activation line 208 are in the first metal layer 503. The first activation line 206 is adjacent to a first side of the bitline complement 204 in the first metal layer 503. The first capacitive line 205 is adjacent to a first side of the bitline 203 and the second capacitive line 207 is adjacent to a second side of the bitline 203 in the first metal layer 503. The first capacitive line 205 and the second capacitive line 207 are in a same metal layer 503 of the memory device 200.

Figure 6:
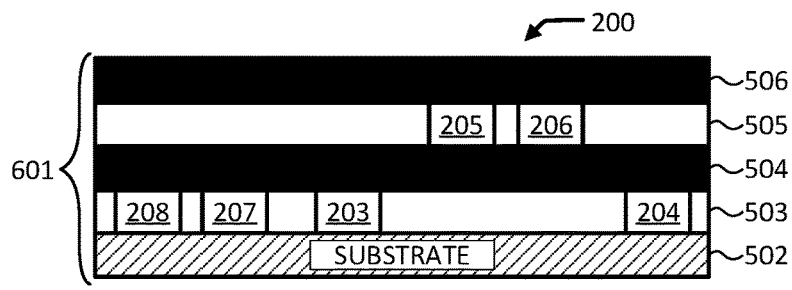
FIG. 6 is a cross-sectional view along line 1-1 of FIG. 2 in accordance with some additional embodiments.

FIG. 6 is a cross-sectional view along line 1-1 of FIG. 2 in a in accordance with some additional embodiments. The memory device 200 includes layers 601. The layers 601 include metal layers separated by an insulative layer on top of the substrate 502. The first capacitive line 205 is adjacent to the first activation line 206 in the second metal layer 505. The second capacitive line 207 and the second activation line 208 are in the first metal layer 503. The first metal layer 503 is separated from the second metal layer 505 by the first insulative layer 504. The second capacitive line 207 is adjacent to a side of the bitline 203 in the first metal layer 503. The second activation line 208 is adjacent to a side of the second capacitive line 207 in the memory device 200.

In some embodiments, the apparatus and techniques described above are implemented in a system including one or more integrated circuit (IC) devices (also referred to as integrated circuit packages or microchips), such as the memory devices 100 and 200 described above with reference to FIGS. 1-2. Electronic design automation (EDA) and computer aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A memory device comprising:
   a memory cell coupled to a bitline and a bitline complement;
   a first capacitive structure configured to be charged by a first voltage supply, the first capacitive structure being a line structure;
   a first activation line extending parallel to the first capacitive structure, the first capacitive structure and the first activation line extending parallel to the bitline, the first capacitive structure and the first activation line forming a first capacitor, wherein the first activation line is coupled to the bitline;
   a second capacitive structure configured to be charged by a second voltage supply different from the first voltage supply, the second capacitive structure being a line structure; and
   a coupling structure configured to apply a write assist voltage to the memory cell during a write operation by selectively and capacitively couple the first capacitive structure and the second capacitive structure to the bitline and the bitline complement to apply a concurrent combination of the first voltage supply and the second voltage supply as the write assist voltage.

2. The memory device of claim 1, wherein the first capacitive structure is in a first metal layer of the memory device.

3. The memory device of claim 2, wherein:
   the second capacitive structure is a line structure and is in a second metal layer of the memory device, and
   the first metal layer is an adjacent metal layer to the second metal layer in the memory device, the first metal layer separated from the second metal layer by an insulative layer.

4. The memory device of claim 3, wherein the first capacitive structure extends proximate to a first side of the bitline complement.

5. The memory device of claim 1, wherein the first capacitive structure and the second capacitive structure are in a same metal layer of the memory device.

6. The memory device of claim 1, wherein the first capacitive structure and the first activation line extend in a same orientation as the bitline or the bitline complement in the memory device.

7. The memory device of claim 6, wherein the first activation line extends adjacent to a plurality of memory cells in the memory device, the memory device further comprising:
   a second activation line extending parallel to the second capacitive structure, the second capacitive structure and the second activation line extending parallel to the bitline complement, the second capacitive structure and the second activation line forming a second capacitor, wherein the second activation line is coupled to the bitline complement.

8. The memory device of claim 1, wherein the first capacitive structure extends proximate to a first side of the bitline.

9. The memory device of claim 8, wherein the second capacitive structure extends proximate to a second side of the bitline.

10. The memory device of claim 1, wherein the first voltage supply is configured to charge the first capacitive structure to a first potential within a first voltage range, wherein the second voltage supply is configured to charge the second capacitive structure to a second potential within a second voltage range, the second voltage range being greater than the first voltage range.

11. The memory device of claim 10, wherein:
   the first voltage supply comprises a memory supply voltage and the first voltage range is a memory supply voltage range; and
   the second voltage supply comprises a core supply voltage and the second voltage range is a core supply voltage range, wherein the core supply voltage range is greater than the memory supply voltage range.

12. The memory device of claim 1, further comprising:
   a transistor to electrically couple the bitline and the bitline complement to the memory cell to write a bit value into the memory cell.

13. An apparatus comprising:
   a memory cell configured to store a bit value;
   a pair of bitlines coupled to the memory cell;
   a pair of write data (WD) lines;
   a first capacitive structure adjacent to one of the pair of WD lines and chargeable by a first voltage provided by a first voltage supply, wherein the first capacitive structure is a line structure in a metal layer of the apparatus, and wherein the first capacitive structure extends in a same orientation as one of the pair of the WD lines;

a second capacitive structure adjacent to another of the pair of WD lines and chargeable by a second voltage provided by a second voltage supply that provides a second voltage different from the first voltage, wherein the second capacitive structure is a line structure in a metal layer of the apparatus; and an electrical coupler configured to selectively and capacitively connect the pair of WD lines with the pair of bitlines to apply a concurrent combination of the first voltage supply and the second voltage supply as a write assist voltage to the memory cell as part of a write assist operation to the memory cell.

14. The apparatus of claim 13, wherein the first capacitive structure extends adjacent to a plurality of memory cells in the apparatus.

15. The apparatus of claim 13, wherein the first voltage is within a first voltage range, wherein the second voltage is within a second voltage range wider than the first voltage range.

16. The apparatus of claim 13, further comprising:

a write data driver coupled to the pair of bitlines and configured to drive the pair of bitlines in response to a state of a signal provided to the write data driver, the write data driver configured to use the first capacitive structure and the second capacitive structure for the write assist operation to the memory cell.

17. A method of operating a memory cell of a memory device, the method comprising:

providing a negative write assist to the memory cell by concurrently capacitively coupling to a bitline and a bitline complement of the memory cell both of:

a first capacitive structure charged by a first voltage from a first voltage supply, wherein the first capacitive structure is a line structure in a metal layer of the memory device, and wherein the first capacitive structure extends in a same orientation as one of the bitline or the bitline complement; and a second capacitive structure charged by a second voltage from a second voltage supply, the first and second voltages being applied as a concurrent combination of the first voltage supply and the second voltage supply to the memory cell, and wherein the second capacitive structure is a line structure.

18. The method of claim 17, further comprising:

disconnecting the memory cell from a write driver prior to concurrently capacitively coupling the first capacitive structure and the second capacitive structure to the bitline or the bitline complement.

19. The method of claim 17, further comprising:

writing a bit value into the memory cell;

decoupling a write driver from the bitline and the bitline complement; and providing a negative write assist signal to trigger the negative write assist to the memory cell.

20. The method of claim 17, further comprising:

the first voltage supply providing the first voltage within a first voltage range; and the second voltage supply providing the second voltage within a second voltage range wider than the first voltage range.

* * * * *

UNITED STATES PATENT AND TRADEMARK OFFICE
CERTIFICATE OF CORRECTION

PATENT NO. : 10,332,570 B1
APPLICATION NO. : 15/838955
DATED : June 25, 2019
INVENTOR(S) : Tawfik Ahmed Page 1 of 1

It is certified that error appears in the above-identified patent and that said Letters Patent is hereby corrected as shown below:

In the Claims

At Column 6, Claim 3, Line 10, please delete "capacitive structure is a line structure and is in a second" and insert --capacitive structure is in a second--

Signed and Sealed this
Thirty-first Day of March, 2020

Andrei Iancu
*Director of the United States Patent and Trademark Office*